United States Patent
Schaller et al.

(10) Patent No.: US 11,493,538 B2
(45) Date of Patent: Nov. 8, 2022

(54) SENSOR DEVICES WITH SENSOR CHIP AND BUSBAR

(71) Applicant: Infineon Technologies AG, Neubiberg (DE)

(72) Inventors: Rainer Markus Schaller, Saal a.d. Donau (DE); Juergen Hoegerl, Regensburg (DE); Volker Strutz, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/947,910

(22) Filed: Aug. 24, 2020

(65) Prior Publication Data

US 2021/0063445 A1 Mar. 4, 2021

(30) Foreign Application Priority Data

Sep. 2, 2019 (DE) .................. 102019123472.7

(51) Int. Cl.
*G01R 15/20* (2006.01)
*G01R 19/00* (2006.01)

(52) U.S. Cl.
CPC ....... *G01R 15/205* (2013.01); *G01R 19/0092* (2013.01)

(58) Field of Classification Search
CPC ............ G01R 15/205; G01R 15/207; G01R 19/0092; H01B 5/02
See application file for complete search history.

(56) References Cited

U.S. PATENT DOCUMENTS

| | | | |
|---|---|---|---|
| 2005/0161809 A1* | 7/2005 | Nakatsu | H02M 7/003 257/734 |
| 2012/0112365 A1* | 5/2012 | Ausserlechner | G01R 15/20 438/126 |
| 2014/0218018 A1* | 8/2014 | Ivanov | G01R 33/02 324/252 |
| 2014/0225593 A1* | 8/2014 | Nakajima | G01R 15/20 324/117 R |
| 2015/0076636 A1* | 3/2015 | Beer | G01R 33/0047 257/427 |
| 2018/0188294 A1* | 7/2018 | Kawanami | G01R 19/0092 |
| 2019/0170791 A1* | 6/2019 | Hetzler | G01R 1/203 |
| 2019/0234996 A1 | 8/2019 | Nomura et al. | |
| 2020/0064417 A1* | 2/2020 | Shimizu | G01R 15/207 |

FOREIGN PATENT DOCUMENTS

DE 10 2009 054 892 A1 7/2010
DE 10 2011 005 994 A1 9/2011

* cited by examiner

*Primary Examiner* — Dominic E Hawkins
(74) *Attorney, Agent, or Firm* — Harrity & Harrity, LLP (57) ABSTRACT

A sensor device comprises a dielectric substrate, a busbar mechanically connected to the dielectric substrate, a cavity formed in the dielectric substrate, and a sensor chip arranged in the cavity, wherein the sensor chip is designed to detect a magnetic field induced by an electric current flowing through the busbar, wherein in an orthogonal projection of the sensor chip onto the busbar, the sensor chip at least partly overlaps the busbar.

20 Claims, 7 Drawing Sheets

SENSOR DEVICES WITH SENSOR CHIP AND BUSBAR

CROSS REFERENCE TO RELATED APPLICATION

This application claims priority to German Patent Application No. 102019123472.7 filed on Sep. 2, 2019, the content of which is incorporated by reference herein in its entirety.

TECHNICAL FIELD

The present disclosure generally relates to sensor devices. For example, the disclosure relates to sensor devices with sensor chip and busbar.

BACKGROUND

Sensor devices can contain a sensor chip and a busbar. The busbar can be designed to carry an electric current to be measured, while the sensor chip can be designed to detect a magnetic field induced by the electric current flowing through the busbar. In this case, the measurement between the sensor chip and the busbar can be effected with no contact.

BRIEF SUMMARY

Implementations described herein may provide good sensor performance and a reliable isolation between a sensor chip and a busbar. Various aspects relate to a sensor device. The sensor device comprises a dielectric substrate. The sensor device furthermore comprises a busbar mechanically connected to the dielectric substrate. The sensor device furthermore comprises a cavity formed in the dielectric substrate. The sensor device furthermore comprises a sensor chip arranged in the cavity, wherein the sensor chip is designed to detect a magnetic field induced by an electric current flowing through the busbar. In an orthogonal projection of the sensor chip onto the busbar, the sensor chip at least partly overlaps the busbar.

Various aspects relate to a sensor device. The sensor device comprises a shell. The sensor device furthermore comprises a busbar arranged in the shell. The sensor device furthermore comprises a sensor package arranged in the shell, comprising a sensor chip encapsulated in the sensor package, wherein the sensor chip is designed to detect a magnetic field induced by an electric current flowing through the busbar. In an orthogonal projection of the sensor chip onto the busbar, the sensor chip at least partly overlaps the busbar.

Various aspects relate to a sensor device. The sensor device comprises a busbar having an opening. The sensor device furthermore comprises a sensor package, comprising an encapsulation material and a sensor chip encapsulated by the encapsulation material. The sensor chip is designed to detect a magnetic field induced by an electric current flowing through the busbar. The sensor package is arranged within the opening of the busbar.

Various aspects relate to a sensor device. The sensor device comprises a pre-encapsulated leadframe, comprising a leadframe and an encapsulation material, wherein the leadframe is encapsulated by the encapsulation material, and wherein a part of the leadframe forms a busbar. The sensor device furthermore comprises a sensor chip arranged above the busbar, wherein the sensor chip is arranged outside the encapsulation material and wherein the sensor chip is designed to detect a magnetic field induced by an electric current flowing through the busbar. In an orthogonal projection of the sensor chip onto the busbar, the sensor chip at least partly overlaps the busbar. The encapsulation material of the pre-encapsulated leadframe is arranged between the busbar and the sensor chip.

BRIEF DESCRIPTION OF THE DRAWINGS

Sensor devices in accordance with the disclosure are explained in greater detail below with reference to the drawings. The elements shown in the drawings are not necessarily rendered in a manner true to scale relative to one another. Identical reference signs may designate identical components.

DETAILED DESCRIPTION

Figure 1:
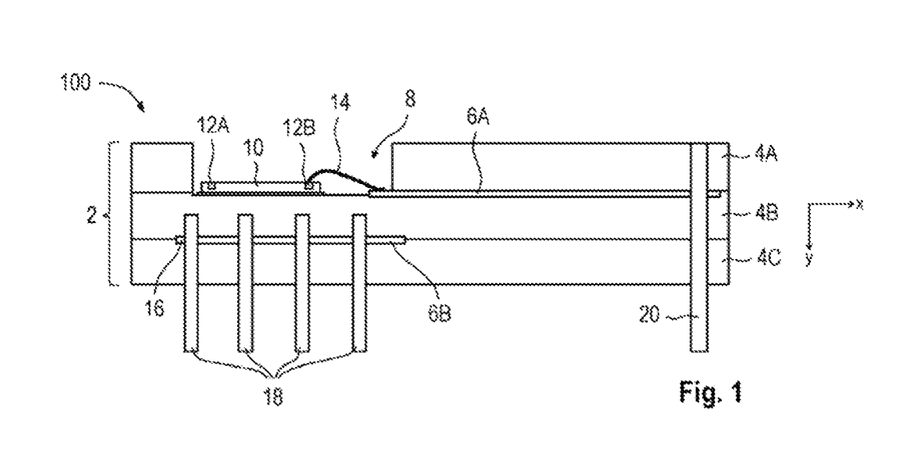
FIG. 1 schematically shows a cross-sectional side view of a sensor device 100 in accordance with the disclosure.

FIG. 1 schematically shows a cross-sectional side view of a sensor device 100 in accordance with the disclosure. The sensor device 100 is illustrated in a general way in order to describe aspects of the disclosure qualitatively. The sensor device 100 can have further aspects, not illustrated in FIG. 1 for the sake of simplicity. For example, the sensor device 100 can be extended by any desired aspect described in association with other sensor devices in accordance with the disclosure. Explanations concerning FIG. 1 may equally apply to other sensor devices described herein.

The sensor device 100 can comprise a dielectric substrate 2 having one or more dielectric layers 4A to 4C. One or more electrically conductive layers 6A, 6B can be arranged between the dielectric layers 4A to 4C. A cavity 8 can be formed in the dielectric substrate 2. A sensor chip 10 having one or more sensor elements 12A, 12B can be arranged in the cavity 8. The sensor chip 10 can be electrically connected to one of the electrically conductive layers 6A by way of an electrical connection element 14. A busbar 16 can be arranged in the dielectric substrate 2. Connecting conductors 18 can project from the dielectric substrate 2, which connecting conductors can be electrically connected to the busbar 16. A further connecting conductor 20 projecting from the dielectric substrate 2 can be electrically connected to the sensor chip 10 by way of the electrically conductive layer 6A and the electrical connection element 14.

The dielectric substrate 2 can be constructed from one or more dielectric layers 4. In the example in FIG. 1, the dielectric substrate 2 can comprise three dielectric layers 4A to 4C. In further examples, the dielectric substrate 2 can be two-layered, four-layered, five-layered, etc. By way of example, the dielectric substrate 2 can be a laminated or a PCB (printed circuit board) substrate. The dielectric layers 4 can be fabricated from a polymer, for example an epoxy resin, acrylate or a thermoplastic or thermally curing material. In one example, the dielectric layers 4 can be produced from a filled or unfilled prepreg material, which can involve a combination of a fiber mat, for example glass or carbon fibers, and a resin, for example a thermosetting plastic material. Prepreg materials can be used for producing PCB substrates. Prepreg materials that can be used here as dielectric material are, for example: FR-2, FR-3, FR-4, FR-5, FR-6, CEM-1, CEM-2, CEM-3, CEM-4, CEM-5.

The electrically conductive layers 6 can for example be embodied as metal layers and be arranged on the top side and/or underside of the dielectric substrate 2 and/or between the dielectric layers 4. In the example in FIG. 1, an electrically conductive layer 6B can form the busbar 16 within the dielectric substrate 2. The busbar 16 can thus be mechanically connected to the dielectric substrate 2 and cannot be arranged outside the dielectric substrate 2. The busbar 16 can be designed to carry an electric current to be measured. Furthermore, the electrically conductive layers 6 can form a redistribution wiring that can be designed to provide an electrical contacting of the sensor chip 10 and of the busbar 16 from outside the dielectric substrate 2. In FIG. 1, by way of example, the sensor chip 10 can be electrically contacted by way of the electrically conductive layer 6A. Furthermore, the electrically conductive layers 6 can be designed to provide a redistribution wiring between components arranged in and on the dielectric substrate 2. The electrically conductive layers 6 can be embodied for example as metallic redistribution layers or conductor tracks. By way of example, the following metals or alloys thereof can be used as material: copper, aluminum, nickel, palladium, silver, tin, gold.

The sensor chip 10 arranged in the cavity 8 or the sensor elements 12A, 12B can be designed to detect a magnetic field induced by an electric current flowing through the busbar 16. The intensity of the electric current can be determined on the basis of the detected magnetic field or the detected magnetic flux density of the induced magnetic field. In this case, detecting the induced magnetic field can be effected in particular in a galvanically isolated manner or with no contact. In this case, in an orthogonal projection of the sensor chip 10 or the sensor elements 12A, 12B along the y-direction onto the busbar 16, the sensor chip 10 or the sensor elements 12A, 12B can at least partly overlap the busbar 16. The physical signals detected by the sensor chip 10 can be converted into electrical signals for further processing and can be forwarded by way of the electrical connection element 14, by way of the electrically conductive layer 6A and by way of the connecting conductor 20 to further components (not shown) for further processing or evaluation. In the example in FIG. 1, the electrical connection element 14 can be a wire. In further examples, the electrical connection element 14 can be formed by a ribbon or a clip.

Two sensor elements 12A, 12B are illustrated in the example in FIG. 1. In further examples, the sensor chip 10 can comprise only one sensor element or more than two sensor elements. By way of example, the sensor chip 10 can be a differential magnetic field sensor chip. The sensor elements 12A, 12B can be Hall sensor elements, magnetoresistive sensor elements, vertical Hall sensor elements or fluxgate sensor elements. A magnetoresistive xMR sensor element can be embodied in the form of an AMR sensor element, GMR sensor element or TMR sensor element. In the example in FIG. 1, the sensor elements 12A, 12B can be arranged on a side of the sensor chip 10 facing away from the busbar 16. In a further example, the sensor elements 12A, 12B can be arranged on a side of the sensor chip 10 facing the busbar 16.

The cavity 8 arranged in the dielectric substrate 2 can be formed in one or more of the dielectric layers 4A to 4C. In the example in FIG. 1, the cavity 8 can be hollow apart from components arranged therein, e.g. can be filled with air, in particular. The hollow cavity 8 can be closed by a cover (not shown), for example. In a further example, an encapsulation material (not shown) can be arranged in the cavity 8, which encapsulation material can at least partly encapsulate the sensor chip 10 and/or the electrical connection element 14 in order to protect same against external influences. The encapsulation material can comprise for example at least one of the following: a mold compound, a laminate, an epoxy, a filled epoxy, a glass-fiber-filled epoxy, an imide, a thermoplastic, a thermosetting polymer, a polymer mixture, a glob top material.

The connecting conductors 18, 20 can be designed to mechanically and electrically connect the sensor device 100 to a circuit board or printed circuit board (not shown). In the example in FIG. 1, the connecting conductors 18, 20 can be embodied as substantially rectilinear and extend in a substantially identical direction. By way of example, the connecting conductors 18, 20 can have the form of a pin array. One or more through holes can be formed in the dielectric substrate 2 and can be designed to receive the connecting conductors 18 and/or 20. By way of example, the connecting conductors 18, 20 can be inserted as a pin array into the through holes. The through holes and/or the connecting conductors 18, 20 of a pin array can be arranged in a simple and flexible manner and can thereby be effectively coordinated or made compatible with the design of a circuit board, and vice-versa. In one example, the through holes can be via holes. The connecting conductors 18 received by the through holes can be electrically connected to the busbar 16. FIG. 1 illustrates by way of example four connecting conductors 18 electrically connected to the busbar 16. The connecting conductor and/or sensor pin 20 received into the through holes can be electrically connected to the sensor chip 10 by way of the redistribution layer 6A and by way of the electrical connection element 14.

The sensor device 100 can be a coreless sensor device, in particular; that is to say that the sensor device 100 may not comprise or use a magnetic field concentrator to concentrate the magnetic field induced by the electric measurement current.

Figure 2:
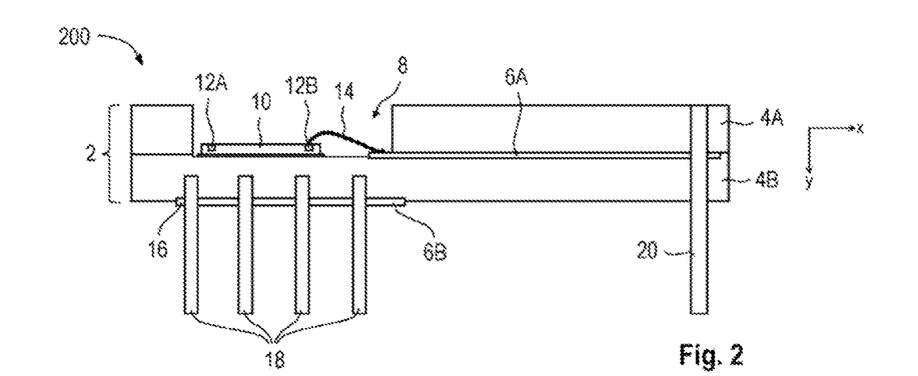
FIG. 2 schematically shows a cross-sectional side view of a sensor device 200 in accordance with the disclosure.
Figure 3:
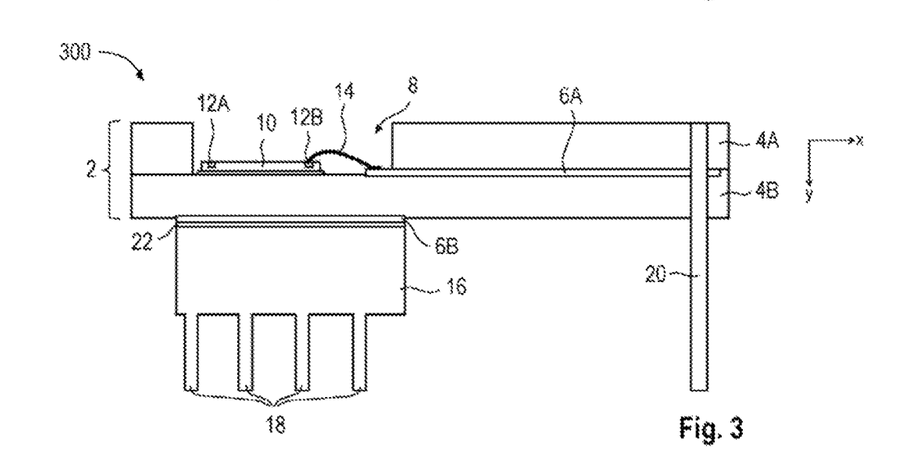
FIG. 3 schematically shows a cross-sectional side view of a sensor device 300 in accordance with the disclosure.
Figure 4:
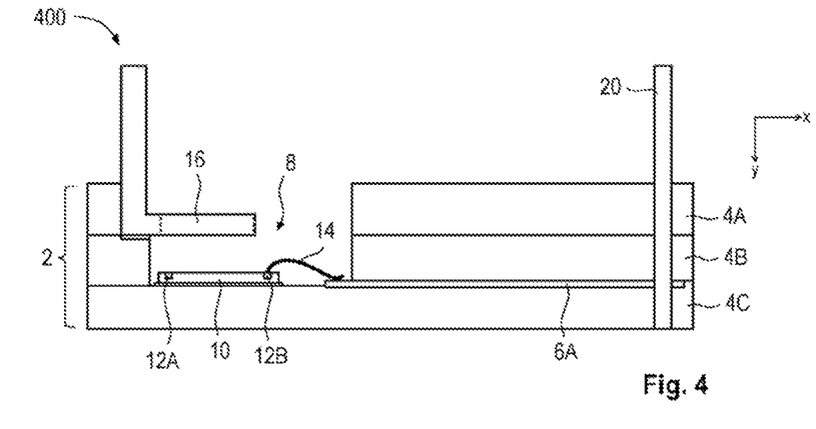
FIG. 4 schematically shows a cross-sectional side view of a sensor device 400 in accordance with the disclosure.

FIGS. 2 to 4 schematically show cross-sectional side views of sensor devices 200 to 400 in accordance with the disclosure. The sensor devices 200 to 400 can be at least partly similar to the sensor device 100 in FIG. 1, such that explanations concerning FIG. 1 may also be applicable to each of FIGS. 2 to 4.

In the example in FIG. 2, the dielectric substrate 2 can be two-layered, e.g. comprise two dielectric layers 4A, 4B arranged one above the other. The busbar 16 can be formed by an electrically conductive layer 6B on an outer surface of the dielectric substrate 2. In FIG. 2, the busbar 16 can be arranged on the underside of the dielectric substrate 2, for example. In one example, the connecting conductors 18 can be inserted in the form of a pin array into through holes that can be formed in the busbar 16 and the dielectric substrate 2. In a further example, the busbar 16 and the connecting conductors 18 can be fabricated as an integral metal component. The metal component can be inserted into through holes of the dielectric substrate 2. In a manner similar to FIG. 1, the connecting conductors 18 can be arranged in a simple and flexible manner and can thereby be coordinated with the design of a circuit board, and vice-versa.

In the example in FIG. 3, the busbar 16 and the connecting conductors 18 can be embodied as an in particular integral metal component. The metal component can be secured, for example soldered, to a metallization (electrically conductive layer) 6B on the underside of the dielectric substrate 2 by a solder material 22. The electrically conductive layer 6B may or may not be regarded as part of the busbar 16. In comparison with FIG. 2, the metal component in FIG. 3 can have an increased current-carrying capacity on account of its larger dimensions.

In the example in FIG. 4, the dielectric substrate 2 can be three-layered and comprise three dielectric layers 4A to 4C arranged one above another. In this case, the cavity 8 can be formed for example in the upper two dielectric layers 4A, 4B. In the example in FIG. 4, a dimension of the cavity 8 in the x-direction in the upper dielectric layer 4A can be larger than a dimension of the cavity 8 in the x-direction in the lower dielectric layer 4B. As a result, the busbar 16 can be arranged on a step formed by the dielectric layers 4A, 4B. The busbar 16 can thus be arranged directly above the sensor chip 10 or the sensor elements 12A, 12B; that is to say that in an orthogonal projection of the sensor chip 10 onto the busbar 16, the sensor chip 10 or the sensor elements 12A, 12B can at least partly overlap the busbar 16. In one example, an encapsulation material (not shown) can be arranged in the cavity 8, which encapsulation material can at least partly encapsulate the sensor chip 10 and/or the busbar 16. In a further example, the cavity 8 can be hollow and be sealed by a cover (not shown).

In the example in FIG. 4, the busbar 16 can be formed for example by a prefabricated insert that is inserted into the dielectric substrate 2. In this case, the insert can be fabricated in particular in an integral fashion. Example perspective views of busbars such as can be used in the sensor device 400 in FIG. 4 are shown and described in FIGS. 20 and 21. In contrast to FIGS. 1 to 3, the busbar 16 and the connecting conductor 20 can project from a top side of the dielectric substrate 2.

Figure 5:
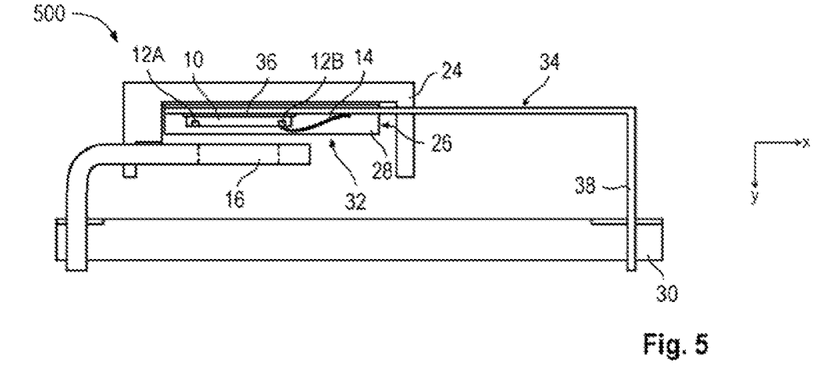
FIG. 5 schematically shows a cross-sectional side view of a sensor device 500 in accordance with the disclosure.

FIG. 5 schematically shows a cross-sectional side view of a sensor device 500 in accordance with the disclosure. The sensor device 500 is illustrated in a general way in order to describe aspects of the disclosure qualitatively. The sensor device 500 can have further aspects, not illustrated in FIG. 5 for the sake of simplicity. For example, the sensor device 500 can be extended by any desired aspects described in association with other sensor devices in accordance with the disclosure. Explanations concerning FIG. 5 may equally apply to other sensor devices described herein.

The sensor device 500 can comprise a shell 24. A busbar 16 and a sensor package (sensor housing) 26 can be arranged in the shell 24. The sensor package 26 can comprise a chip carrier 34 and, arranged thereon, a sensor chip 10 having one or more sensor elements 12A, 12B. The sensor chip 10 can be electrically connected to the chip carrier 34 by way of one or more electrical connection elements 14. The described components of the sensor package 26 can be encapsulated by an encapsulation material 28. The sensor device 500 can be mechanically and electrically connected to a printed circuit board (or circuit board) 30 by way of the busbar 16 and the chip carrier 34. The printed circuit board 30 may or may not be regarded as part of the sensor device 500.

The shell (or the cup, the pot or the trough) 24 can form a cavity 32, which can form a container for the busbar 16 and the sensor package 26. The shell 24 can be open toward one side and can have openings at its sidewalls, through which openings the busbar 16 and the chip carrier 34 can extend. In FIG. 5, the opening of the shell 24 faces the printed circuit board 30. In one example, the shell 24 can be fabricated from an electrically insulating material, for example from at least one from plastic, ceramic, glass. In a further example, the shell 24 can be fabricated from an electrically conductive material, for example from a metal or a metal alloy. Besides its function as a container for the busbar 16 and the sensor package 26, the shell 24 can provide additional functions, for example an electrical shielding function and/or a heat dissipating function.

In one example, the cavity 32 can be sealed by a cover (not shown), wherein the busbar 16 and the sensor package 26 can be arranged in the cavity 32 formed by the shell 24 and the cover. In a further example, an encapsulation material (not shown) can be arranged in the shell 24 or the cavity 32, wherein the busbar 16 and the sensor package 26 can be encapsulated by the encapsulation material. The encapsulation material can comprise for example at least one of the following: a mold compound, a laminate, an epoxy, a filled epoxy, a glass-fiber-filled epoxy, an imide, a thermoplastic, a thermosetting polymer, a polymer mixture, a glob top material. Apart from the opening of the cavity 32 on one side, the shell 24 can be sufficiently sealed vis-à-vis an initially liquid encapsulation material.

The busbar 16 can be designed to carry an electric current to be measured. The busbar 16 can be produced from a metal and/or a metal alloy (e.g. copper, copper alloy) and can be embodied in particular in an integral fashion. The busbar 16 can extend through an opening in the shell 24 into the cavity 32 and can be arranged above the sensor chip 10. In the example in FIG. 5, the opening can be formed in the left sidewall of the shell 24. In the example in FIG. 5, that section of the busbar 16 which is situated outside the shell 24 can be bent downward in order to be mechanically and electrically connected to the printed circuit board 30 arranged below the sensor device 500. In the side view in FIG. 5, only one contact of the busbar 16 with the printed circuit board 30 is illustrated on account of the perspective chosen. The busbar 16 can furthermore contact the printed circuit board 30 at further points. By way of example, at a first contact point, a measurement current can be fed from the printed circuit board 30 into the busbar 16 and, at a second contact point, the measurement current that has passed through the busbar 16 can be output from the busbar 16 to the printed circuit board 30. Example busbars are shown and described in FIGS. 18 to 21.

The sensor package 26 can be secured on a base surface of the shell 24. The sensor package 26 can be any desired type of package, for example an SO (small outline) sensor package. The chip carrier 34 can be embodied as a leadframe, for example, which can have one or more die pads 36 and one or more connecting conductors (leads) 38. In FIG. 5, the chip carrier 34 is illustrated in a continuous fashion or as a single component, for the sake of simplicity. However, the connecting conductor 38 or at least one of the plurality of connecting conductors 38 can be mechanically separated and electrically isolated from the die pad 36. By way of example, the leadframe can be produced completely from metals and/or metal alloys, in particular from copper, copper alloys, nickel, iron-nickel, aluminum, aluminum alloys, steel, stainless steel.

The connecting conductor 38 can project from the encapsulation material 28 of the sensor package 26 and extend through an opening of the shell 24. In the example in FIG. 5, the opening can be formed in a sidewall of the shell 24. That section of the connecting conductor 38 which is arranged outside the shell 24 can be bent downward in order to be mechanically and electrically connected to the printed circuit board 30 arranged below the sensor device 500. The sensor device 500 can thus be designed to be connected to the printed circuit board 30 by way of the busbar 16 and by way of the connecting conductor(s) 38. The sensor chip 10 can be electrically connected to the connecting conductor 38 by way of the electrical connection element 14, such that the sensor chip 10 can be electrically contacted from outside the encapsulation material 28 of the sensor package 26 and from outside the shell 24.

The sensor chip 10 can be arranged above the die pad 36 such that in an orthogonal projection of the sensor chip 10 or of the sensor elements 12A, 12B along the y-direction onto the busbar 16, the sensor chip 10 or the sensor elements 12A, 12B at least partly overlap the busbar 16. By virtue of such a relative arrangement of the sensor chip 10 and of the busbar 16 within the shell 24, the sensor elements 12A, 12B can be positioned precisely and with no contact in a magnetic field generated by a measurement current flowing through the busbar 16. In FIG. 5, a region of the busbar 16 that is arranged directly above the sensor chip 10 is indicated by dashed lines. In this region, in particular, the busbar 16 can be structured or shaped such that a magnetic field suitable for detection is induced by a measurement current. Examples of structured busbars are shown and described in FIGS. 18 to 21.

The encapsulation material 28 of the sensor package 26 can comprise for example at least one of the following: a mold compound, a laminate, an epoxy, a filled epoxy, a glass-fiber-filled epoxy, an imide, a thermoplastic, a thermosetting polymer, a polymer mixture, a glob top material. The encapsulation material 28 of the sensor package 26 and a further encapsulation material arranged in the shell 24 can be identical or can differ from one another.

The sensor device 500 can be a coreless sensor device, in particular; that is to say that the sensor device 500 may not comprise or use a magnetic field concentrator to concentrate the magnetic field induced by the electrical measurement current.

FIGS. 6 to 12 schematically show cross-sectional side views of sensor devices 600 to 1200 in accordance with the disclosure. The sensor devices 600 to 1200 can be at least partly similar to the sensor device 500 in FIG. 5, such that explanations concerning FIG. 5 may also be applicable to each of FIGS. 6 to 12.

Figure 6:
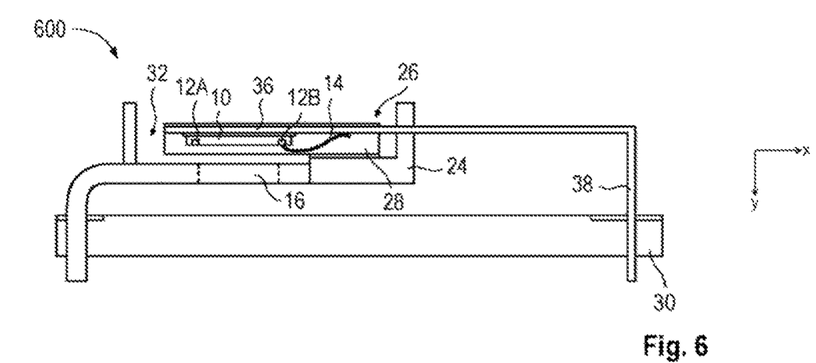
FIG. 6 schematically shows a cross-sectional side view of a sensor device 600 in accordance with the disclosure.

In the example in FIG. 6, the busbar 16 can form a sidewall of the shell 24. In this case, the busbar 16 can be at least partly embedded into the material of the shell 24. In FIG. 6, the busbar 16 can form for example a section of the base surface of the shell 24. The base surface of the shell 24 can thus be formed both by the material of the busbar 16 and by the material of the shell 24 itself. That section of the base surface which is formed by the shell 24 can have a larger thickness in the y-direction than that section of the base surface which is formed by the busbar 16. As a result, it is possible to provide a step between the busbar 16 and the shell 24, such that the sensor package 26 can be arranged on an in particular electrically insulating material of the shell 24. In the example in FIG. 6, the opening of the shell 24 can face away from the printed circuit board 30. Analogously to FIG. 5, the cavity 32 formed by the shell 24 can be closed off by a cover (not shown) or an encapsulation material (not shown) can be arranged in the shell 24 and encapsulate the busbar 16 and/or the sensor package 26. In this case, the encapsulation material can be arranged inter alia between the busbar 16 and the sensor package 26.

Figure 7:
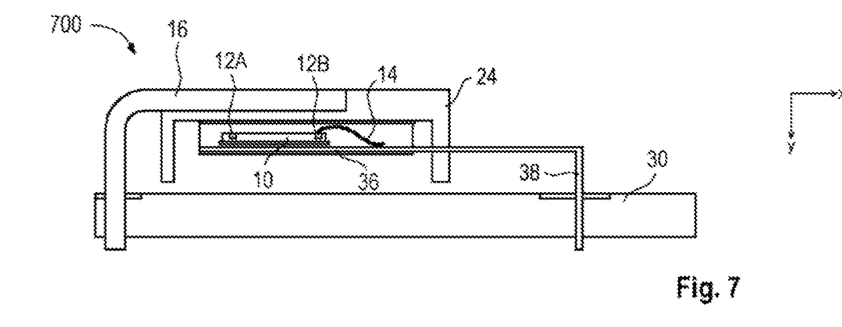
FIG. 7 schematically shows a cross-sectional side view of a sensor device 700 in accordance with the disclosure.

The sensor device 700 in FIG. 7 can be at least partly similar to the sensor device 600 in FIG. 6. Analogously to FIG. 6, the busbar 16 can be embedded into the base surface of the shell 24 and the sensor elements 12A, 12B of the sensor chip 10 can face the busbar 16. In contrast to FIG. 6, the opening of the shell 24 can face the printed circuit board 30.

Figure 8:
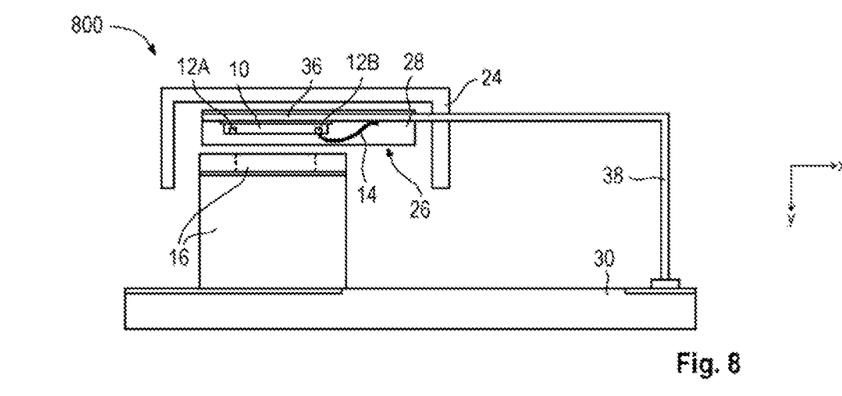
FIG. 8 schematically shows a cross-sectional side view of a sensor device 800 in accordance with the disclosure.

Analogously to preceding examples, in the example in FIG. 8, the connecting conductor 38 can extend through a sidewall of the shell 24. In contrast thereto, the busbar 16 connected to the printed circuit board 30 can project into the shell 24 from below through an opening of the shell 24 facing the printed circuit board 30. In this case, the busbar 16 need not necessarily contact the shell 24. Furthermore, the busbar 16 may or may not contact the encapsulation material 28 of the sensor package 26. A further encapsulation material (not shown) can be arranged in the shell 24 and can encapsulate the busbar 16 and the sensor package 26. The encapsulation material can provide a mechanical connection between the busbar 16, the sensor package 26 and the shell 24, which is not illustrated in the qualitative example in FIG. 8 for the sake of simplicity.

Figure 9:
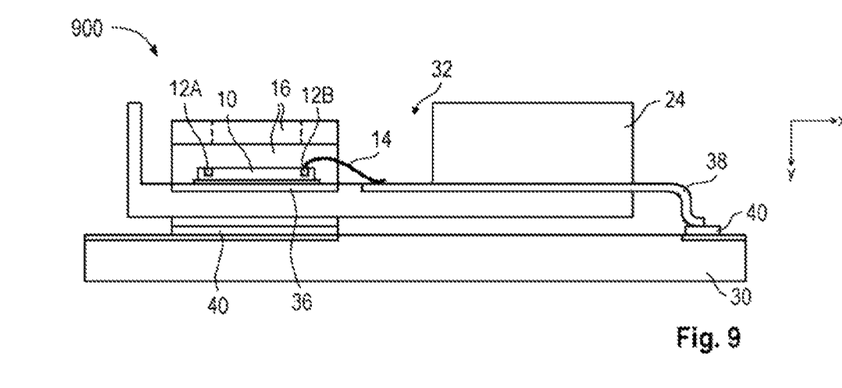
FIG. 9 schematically shows a cross-sectional side view of a sensor device 900 in accordance with the disclosure.

In the example in FIG. 9, the right sidewall of the shell 24 can be thicker in the x-direction than the left sidewall of the shell 24, for example in order to mechanically stabilize a right side of the sensor device 900. A connecting conductor 38 projecting from the right sidewall can have the shape of a wing (gull wing) and can be soldered onto an electrical contact or onto a conductor track of the printed circuit board 30 by way of a solder material 40. In an analogous manner, the busbar 16 can be soldered onto an electrical contact or onto a conductor track of the printed circuit board 30 by way of a solder material 40. The sensor device 900 can thus be mechanically and electrically connected to the printed circuit board 30 by way of the busbar 16 and the connecting conductor 38. Proceeding from the contact with the printed circuit board 30, the busbar 16 can extend upward through an opening in the base surface of the shell 24 into the cavity 32. In an orthogonal projection of the sensor chip 10 or the of the sensor elements 12A, 12B in the y-direction onto the busbar 16, the sensor chip 10 or the sensor elements 12A, 12B can at least partly overlap the busbar 16. The sensor chip 10 can be encapsulated by an encapsulation material, which is not illustrated in FIG. 9 for the sake of simplicity.

Figure 10:
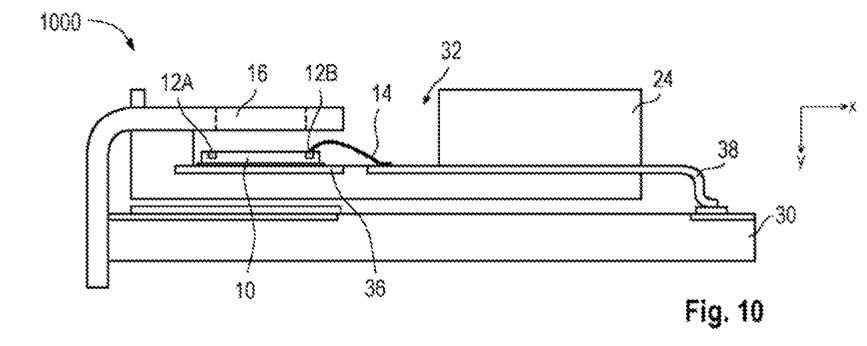
FIG. 10 schematically shows a cross-sectional side view of a sensor device 1000 in accordance with the disclosure.

The sensor device 1000 in FIG. 10 can be at least partly similar to the sensor device 900 in FIG. 9. In contrast to FIG. 9, the busbar 16 in FIG. 10 can extend through a sidewall of the shell 24. That section of the busbar 16 which is arranged outside the shell 24 can be mechanically and electrically connected to the printed circuit board 30. That section of the busbar 16 which extends within the shell 24 can be positioned directly above the sensor chip 10, such that in an orthogonal projection along the y-direction, the sensor elements 12A, 12B at least partly overlap the busbar 16. The busbar 16 can be bent at substantially a right angle, such that the sensor device 1000 can be mounted onto the printed circuit board 30 by way of the busbar 16 and the connecting conductor 38.

Figure 11:
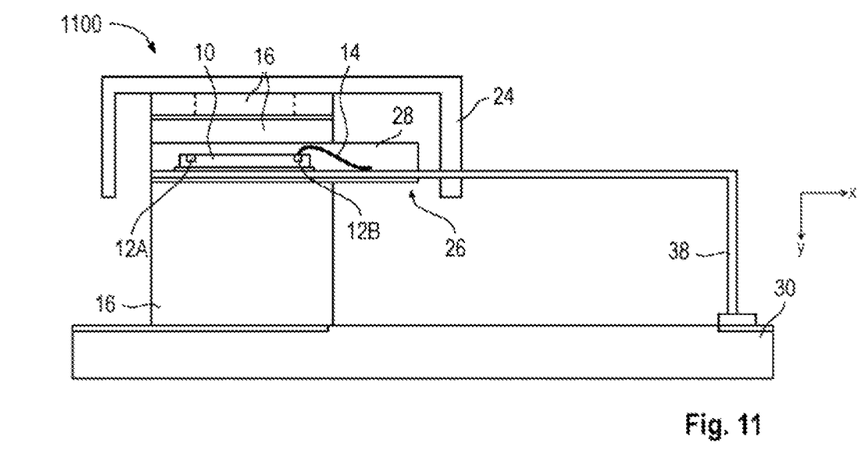
FIG. 11 schematically shows a cross-sectional side view of a sensor device 1100 in accordance with the disclosure.

The sensor device 1100 in FIG. 11 can be at least partly similar to the sensor device 800 in FIG. 8. In contrast to FIG. 8, the busbar 16 can project into the shell 24 further in the (negative) y-direction, such that a part of the busbar 16 can be arranged between the top side of the sensor package 26 and the base surface of the shell 24. In this case, the sensor elements 12A, 12B of the sensor chip 10 can face in particular this upper section of the busbar 16.

Figure 12:
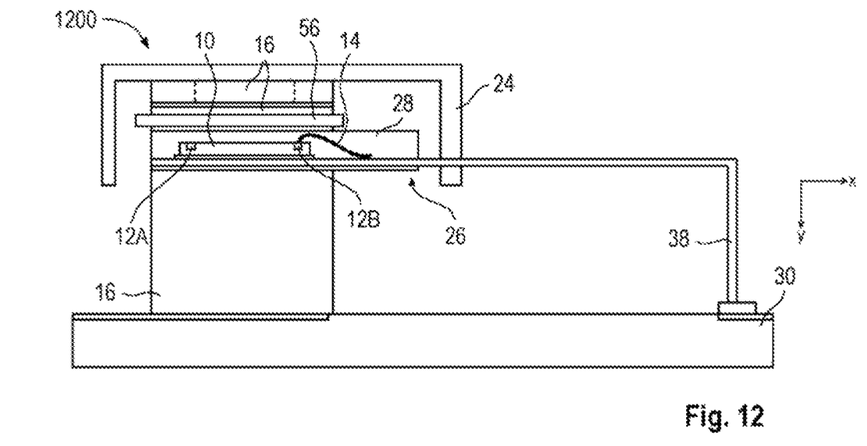
FIG. 12 schematically shows a cross-sectional side view of a sensor device 1200 in accordance with the disclosure.

The sensor device 1200 in FIG. 12 can be at least partly similar to the sensor device 1100 in FIG. 11. In contrast to FIG. 11, the sensor device 1200 can additionally comprise a dielectric 56 arranged between the sensor chip 10 or the sensor package 26 and the busbar 16. In the side view in FIG. 12, a part of the busbar 16 can extend behind the dielectric 56 and be concealed by the dielectric 56. As viewed in the y-direction, a contour of the dielectric 56 can have any desired shape, for example round, oval, elliptic, square, rectangular, polygonal. The dielectric 56 can comprise or be fabricated from one of the following materials, for example: ceramic, glass, silicone-based materials, polymer-based materials. In one specific example, the dielectric 56 can be embodied in the form of a lamina composed of a dielectric material.

Figure 13:
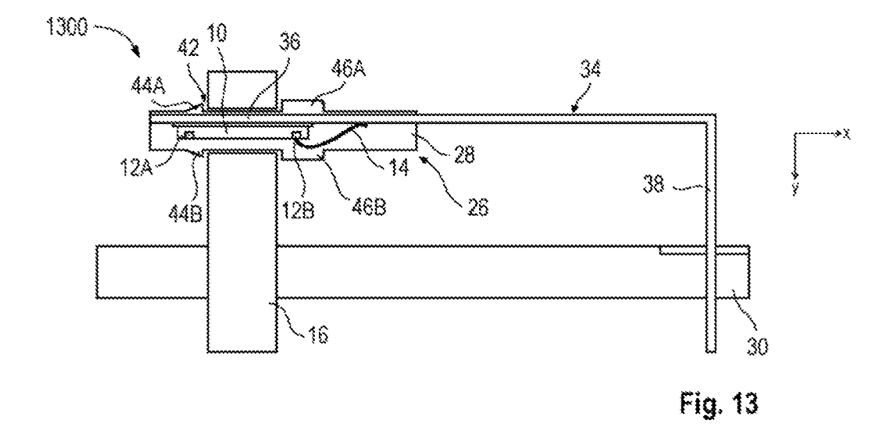
FIG. 13 schematically shows a cross-sectional side view of a sensor device 1300 in accordance with the disclosure.

FIG. 13 schematically shows a cross-sectional side view of a sensor device 1300 in accordance with the disclosure. The sensor device 1300 is illustrated in a general way in order to describe aspects of the disclosure qualitatively. The sensor device 1300 can have further aspects, not illustrated in FIG. 13 for the sake of simplicity. For example, the sensor device 1300 can be extended by any desired aspects described in association with other sensor devices in accordance with the disclosure. Explanations concerning FIG. 13 may equally be applicable to other sensor devices described herein.

The sensor device 1300 can comprise a busbar 16 having an opening 42. A sensor package 26 can be arranged within the opening 42. The sensor package 26 can comprise a chip carrier 34 having one or more die pads 36 and one or more connecting conductors 38. In FIG. 13, the chip carrier 34 is illustrated in a continuous fashion or as a single component for the sake of simplicity. However, the connecting conductor 38 or at least one of the plurality of connecting conductors 38 can be mechanically separated and electrically isolated from the die pad 36. A sensor chip 10 having one or more sensor elements 12A, 12B can be arranged on the die pad 36. The sensor chip 10 can be electrically connected to the connecting conductor 38 by way of one or more electrical connection elements 14. The described components of the sensor package 26 can be encapsulated by an encapsulation material 28. The sensor device 1300 can be mechanically and electrically connected to a printed circuit board 30 by way of the busbar 16 and the connecting conductor 38. The printed circuit board 30 may or may not be regarded as part of the sensor device 1300.

The busbar 16 can be designed to carry an electric current to be measured. The busbar 16 can be produced from a metal and/or a metal alloy (e.g. copper, copper alloy) and can be embodied in particular in an integral fashion. The sensor package 26 can be arranged in the opening 42 such that in an orthogonal projection of the sensor chip 10 or of the sensor elements 12A, 12B along the y-direction onto the busbar 16, the sensor chip 10 or the sensor elements 12A, 12B at least partly overlap the busbar 16. By virtue of such a relative arrangement of the sensor chip 10 in the opening 42 of the busbar 16, the sensor elements 12A, 12B can be positioned precisely and with no contact in a magnetic field generated by a measurement current flowing through the current conductor 16.

The encapsulation material 28 of the sensor package 26 can be shaped such that the sensor package 26 can be locked in the opening 42 of the busbar 16. In the example in FIG. 13, the encapsulation material 28 can respectively have a first locking structure 44 and a second locking structure 46 on its top side and its underside. The first locking structure 44 can have the form of a barb, for example, such as can be used in a wall anchor, for example. The first locking structure 44 can lock the sensor package 26 with respect to the (positive) x-direction. In other words, if the first locking structure 44 contacts the busbar 16, the sensor package 26 can no longer be moved in the (positive) x-direction since the first locking structure 44 can block such a movement. In one example, the first locking structure 44 can extend along the entire periphery of the opening 42. In further examples, the first locking structure 44 can have only one section or a plurality of sections separated from one another along the periphery of the opening 42. In the side view in FIG. 13, the second locking structure 46 can have for example a substantially rectangular shape. As an alternative thereto, the second locking structure 46 can be embodied in the form of a barb in a manner similar to the first locking structure 44. The second locking structure 46 can block a movement of the sensor package 26 in the (negative) x-direction and lock the sensor package 26 in this way.

One or more of the locking structures 44, 46 can be formed from the encapsulation material 28 and integrally therewith. As an alternative or in addition thereto, one or more of the locking structures 44, 46 can be secured to the encapsulation material 28 and can be fabricated from a different material than the encapsulation material 28. In one example, one or more of the locking structures 44, 46 can be embodied as substantially rigid or non-elastically or non-reversibly deformable. In a further example, one or more of the locking structures 44, 46 (in particular in the y-direction) can be elastically or reversibly deformable. In this case, the degree of elasticity can be chosen such that the locking structures 44, 46 (in particular in the y-direction) can be compressed such that a locking of the sensor package 26 can be released and the sensor package 26 can be removed from the opening 42.

The sensor device 1300 can be a coreless sensor device, in particular; that is to say that the sensor device 1300 may not have or use a magnetic field concentrator to concentrate the magnetic field induced by the electric measurement current.

Figure 14:
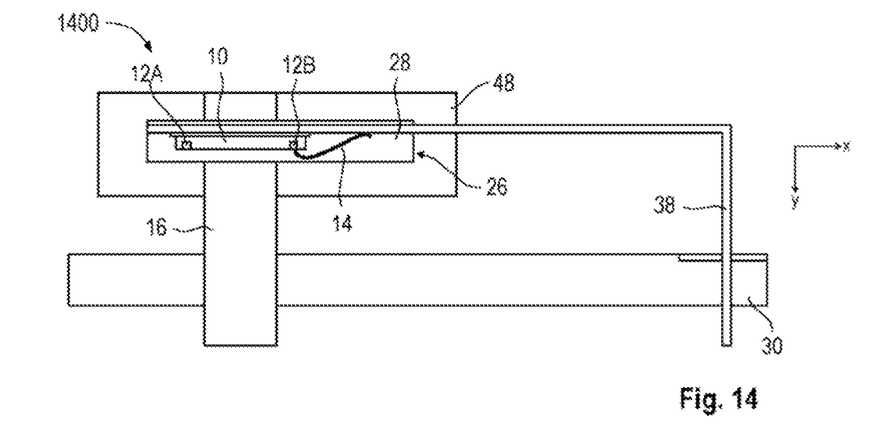
FIG. 14 schematically shows a cross-sectional side view of a sensor device 1400 in accordance with the disclosure.

The sensor device 1400 in FIG. 14 can be at least partly similar to the sensor device 1300 in FIG. 13. Possible locking structures of the sensor package 26 are not explicitly illustrated in FIG. 14. In contrast to FIG. 13, the sensor device 1400 in FIG. 14 can comprise a further encapsulation material 48, which can at least partly encapsulate the busbar 16 and the sensor package 26.

Figure 15:
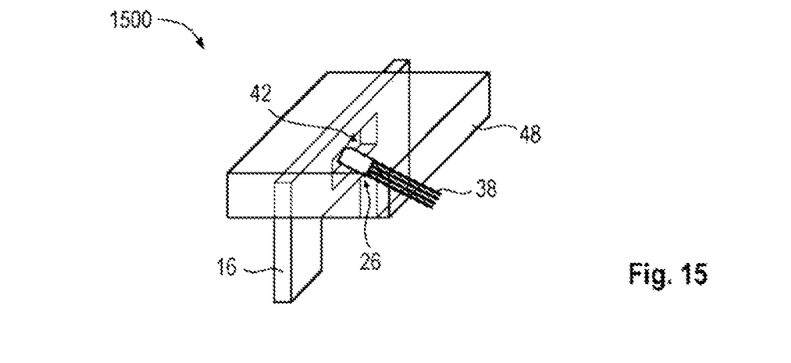
FIG. 15 schematically shows a cross-sectional side view of a sensor device 1500 in accordance with the disclosure.

FIG. 15 schematically shows a perspective view of a sensor device 1500 in accordance with the disclosure. The sensor device 1500 can be similar to the sensor device 1400 in FIG. 14, for example. The opening 42 of the busbar 16 can be bounded completely by the busbar 16. In the example in FIG. 15, the opening 42 can have a rectangular shape. In further examples, the opening 42 can have a different shape, for example oval, elliptic, round, square, polygonal. The busbar 16 can have further deformations or structures, not shown in FIG. 15 for the sake of simplicity. By way of example, the busbar can have deformations as shown and described in FIGS. 18 and 19.

Figure 16:
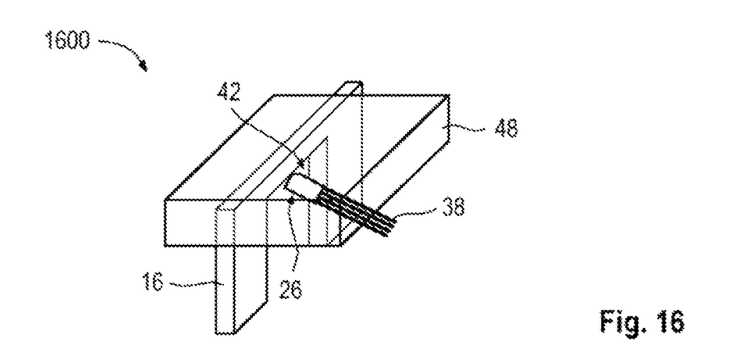
FIG. 16 schematically shows a cross-sectional side view of a sensor device 1600 in accordance with the disclosure.

FIG. 16 schematically shows a perspective view of a sensor device 1600 in accordance with the disclosure. In contrast to FIG. 15, the opening 42 in the example in FIG. 16 can be bounded incompletely by the busbar 16 and have for example the shape of a rectangular cutout bounded on three sides.

Figure 17:
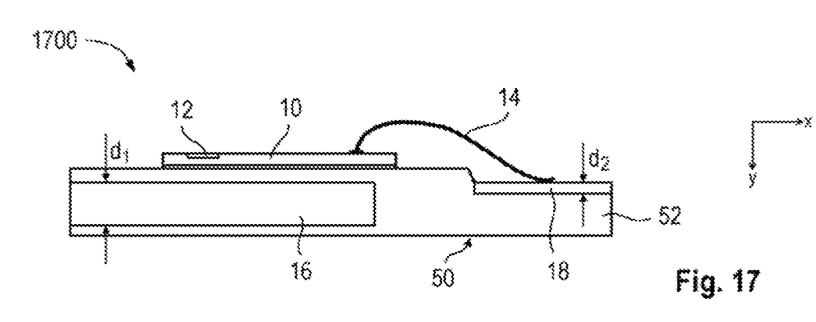
FIG. 17 schematically shows a cross-sectional side view of a sensor device 1700 in accordance with the disclosure.

FIG. 17 schematically shows a cross-sectional side view of a sensor device 1700 in accordance with the disclosure. The sensor device 1700 is illustrated in a general way in order to describe aspects of the disclosure qualitatively. The sensor device 1700 can have further aspects, not illustrated in FIG. 17 for the sake of simplicity. For example, the sensor device 1700 can be extended by any desired aspects described in association with other sensor devices in accordance with the disclosure. Explanations concerning FIG. 17 may equally be applicable to other sensor devices described herein.

The sensor device 1700 can comprise a pre-encapsulated ("pre-molded") leadframe 50. The pre-encapsulated leadframe 50 can comprise a leadframe having a first part 16 and a second part 18. The leadframe can be encapsulated by an encapsulation material 52. A sensor chip 10 having one or more sensor elements 12 can be arranged above the first part 16 of the leadframe. The sensor chip 10 can be electrically connected to the second part 18 of the leadframe by way of an electrical connection element 14.

The leadframe can be fabricated from an electrically conductive material. By way of example, the leadframe can be produced completely from metals and/or metal alloys, in particular from copper, copper alloys, nickel, iron-nickel, aluminum, aluminum alloys, steel, stainless steel. The first part 16 of the leadframe can form a busbar 16, which can be designed to carry an electric current to be measured. The first part or the busbar 16 can be embodied in particular in an integral fashion. The second part 18 of the leadframe can form a connecting conductor 18. Only one connecting conductor 18 is illustrated in the example in FIG. 17. In further examples, the leadframe can have any desired number of further connecting conductors 18. It is possible for the connecting conductor 18 not to be covered by the encapsulation material 52 on its top side, such that the electrical connection element 14 can mechanically and electrically contact the connecting conductor 18 on its exposed top side. A thickness $d_1$ of the busbar 16 can be greater than a thickness $d_2$ of the connecting conductor 18. By way of example, the leadframe can be a dual gauge leadframe.

The sensor chip 10 or the sensor element 12 can be designed to detect a magnetic field induced by an electric current flowing through the busbar 16. In the example in FIG. 17, the sensor element 12 can be arranged on a side of the sensor chip 10 facing away from the busbar 16. The sensor chip 10 can be arranged in particular outside the encapsulation material 52 of the pre-encapsulated leadframe 50. The encapsulation material 52 can in particular be arranged between the busbar 16 and the sensor chip 10 and galvanically isolate these components from one another. The sensor chip 10 can be arranged above the busbar 16 such that in an orthogonal projection of the sensor chip 10 or of the sensor element 12 along the y-direction onto the busbar 16, the sensor chip 10 or the sensor element 12 at least partly overlaps the busbar 16. By virtue of such a relative arrangement of the sensor chip 10 and the busbar 16, the sensor element 12 can be positioned precisely and with no contact in the magnetic field generated by a measurement current flowing through the current conductor 16.

The sensor device 1700 can comprise a further encapsulation material (not shown) embodied in an integral fashion, by which, inter alia, the pre-encapsulated leadframe 50 and the sensor chip 10 can be encapsulated. In this case, in particular, a part of the connecting conductor 18 and a part of the busbar 16 can be left such that they are at least partly not covered by the further encapsulation material, in order that the sensor chip 10 and the busbar 16 can be electrically contacted from outside the further encapsulation material.

Figure 18:
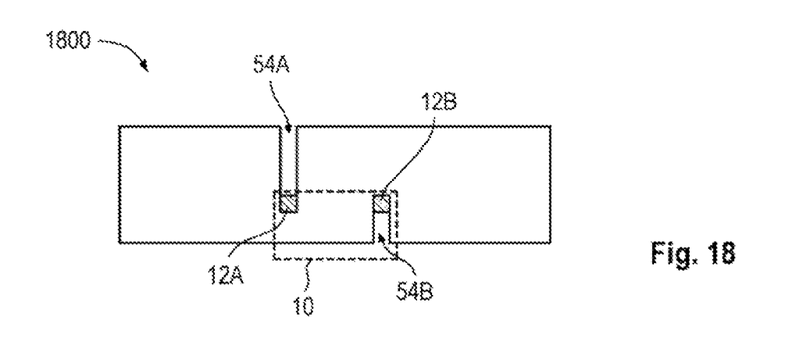
FIG. 18 schematically shows a plan view of a busbar 1800 that can be contained in a sensor device in accordance with the disclosure.
Figure 19:
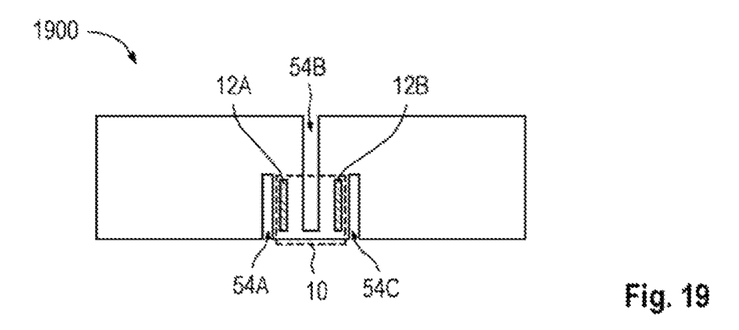
FIG. 19 schematically shows a plan view of a busbar 1900 that can be contained in a sensor device in accordance with the disclosure.

FIGS. 18 and 19 schematically show plan views of busbars 1800 and 1900 that can be contained in the above-described sensor devices in accordance with the disclosure.

FIG. 18 shows a busbar 1800 and, arranged thereabove, a sensor chip 10 having two sensor elements 12A, 12B. The sensor chip 10 can be, in particular, a differential sensor chip and the sensor elements 12A, 12B can be, in particular, Hall sensor elements. The busbar 1800 in FIG. 18 can have two notches 54A, 54B, such that the busbar 1800 can be embodied as substantially S-shaped in the plan view in FIG. 18. An electric measurement current flowing through the busbar 1800 from left to right, for example, can accordingly likewise have a substantially S-shaped course and in this case pass around the left sensor element 12A in the counterclockwise direction and the right sensor element 12B in the clockwise direction. By virtue of such a course of the measurement current, the latter can generate a differential magnetic field having opposite directions at the locations of the sensor elements 12A, 12B, on the basis of which magnetic field the measurement current can be determined. In the plan view in FIG. 18, the busbar 1800 (or the current course of the measurement current) and the sensor elements 12A, 12B can be in each case (at least partly) free of overlap. This makes it possible to ensure that the induced magnetic field at the location of the sensor elements 12A, 12B has a component perpendicular to the respective Hall sensor element. In one example, the busbar 1800 and the sensor elements 12A, 12B can be in each case completely free of overlap. In a further example, the busbar 1800 and the sensor elements 12A, 12B can overlap in each case to the extent of a small part. In this case, the busbar 1800 and the sensor elements 12A, 12B can be at least 80% or at least 85% or at least 90% or at least 95% free of overlap.

FIG. 19 shows a busbar 1900 and, arranged thereabove, a sensor chip 10 having two sensor elements 12A, 12B. The sensor chip 10 can be, in particular, a differential sensor chip and the sensor elements 12A, 12B can be, in particular, magnetoresistive sensor elements or vertical Hall sensor elements or fluxgate sensor elements. By way of example, the sensor elements 12A, 12B can be magnetoresistive xMR sensor elements, in particular AMR sensor elements, GMR sensor elements or TMR sensor elements. The busbar 1900 in FIG. 19 can have three notches 54A to 54C, such that the busbar 1900 and a measurement current course can be embodied in a substantially sinuous fashion in the plan view in FIG. 19. Since the aforementioned types of sensor elements in FIG. 19 may be sensitive in particular vis-à-is an "in-plane" magnetic field component, the sensor elements 12A, 12B can be aligned with the busbar 1900 and/or the measurement current course. In other words, the sensor elements 12A, 12B can be arranged directly above the course of the busbar 1900 and/or of the measurement current. That is to say that in the plan view in FIG. 19, the busbar 1900 and the sensor elements 12A, 12B can in each case (in particular completely) overlap.

Figure 20:
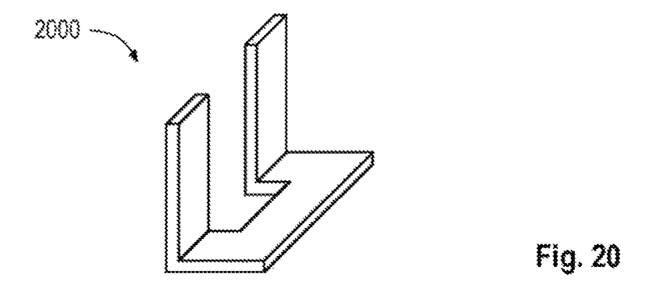
FIG. 20 schematically shows a perspective view of a busbar 2000 that can be contained in a sensor device in accordance with the disclosure.
Figure 21:
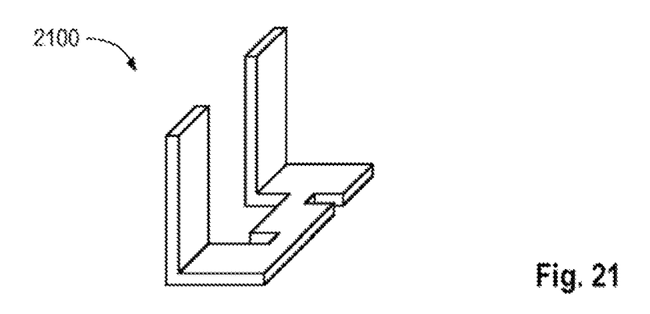
FIG. 21 schematically shows a perspective view of a busbar 2100 that can be contained in a sensor device in accordance with the disclosure.

FIGS. 20 and 21 schematically show perspective views of busbars 2000 and 2100 that can be contained in above-described sensor devices in accordance with the disclosure. By way of example, the busbars 2000 and 2100 can be inserted into a substrate as shown and described in association with FIG. 4. The busbars 2000 and 2100 can each have two substantially vertical sections, which can provide an input and an output for a measurement current. A substantially horizontal section can be arranged between the two vertical sections and can be embodied for example in a U-shape fashion (cf. FIG. 20) or in a meandering or sinuous fashion (cf. FIG. 21). In further examples, the horizontal section of the busbars 2000 and 2100 can have a shape as shown and discussed in FIGS. 18 and 19.

EXAMPLES

Sensor devices are explained below on the basis of examples.

Example 1 is a sensor device, comprising: a dielectric substrate; a busbar mechanically connected to the dielectric substrate; a cavity formed in the dielectric substrate; and a sensor chip arranged in the cavity, wherein the sensor chip is designed to detect a magnetic field induced by an electric current flowing through the busbar, wherein in an orthogonal projection of the sensor chip onto the busbar, the sensor chip at least partly overlaps the busbar.

Example 2 is a sensor device according to example 1, wherein the busbar is formed by an electrical redistribution layer within the dielectric substrate.

Example 3 is a sensor device according to example 1 or 2, wherein the busbar is formed by a prefabricated insert that is inserted into the dielectric substrate.

Example 4 is a sensor device according to any of the preceding examples, wherein the busbar is formed by an electrically conductive layer on an outer surface of the dielectric substrate.

Example 5 is a sensor device according to any of the preceding examples, wherein an electrical connection to the sensor chip is formed by a metallic redistribution layer in the dielectric substrate.

Example 6 is a sensor device according to any of the preceding examples, furthermore comprising: at least one through hole formed in the dielectric substrate and designed to receive at least one connecting conductor, wherein the at least one received connecting conductor is electrically connected to at least one from the busbar or the sensor chip.

Example 7 is a sensor device according to any of the preceding examples, furthermore comprising: an encapsulation material arranged in the cavity, wherein the sensor chip is encapsulated by the encapsulation material.

Example 8 is a sensor device, comprising: a shell; a busbar arranged in the shell; and a sensor package arranged in the shell, comprising a sensor chip encapsulated in the sensor package, wherein the sensor chip is designed to detect a magnetic field induced by an electric current flowing through the busbar, wherein in an orthogonal projection of the sensor chip onto the busbar, the sensor chip at least partly overlaps the busbar.

Example 9 is a sensor device according to example 8, furthermore comprising: an encapsulation material arranged in the shell, wherein the busbar and the sensor package are encapsulated by the encapsulation material.

Example 10 is a sensor device according to example 8, furthermore comprising: a cover, wherein the shell and the cover form a hollow space, wherein the busbar and the sensor package are arranged in the hollow space.

Example 11 is a sensor device according to any of examples 8 to 10, furthermore comprising: a connecting conductor electrically connected to the sensor chip, wherein the connecting conductor and the busbar project from the shell, wherein the sensor device is designed to be connected to a circuit board by way of the parts of the connecting conductor and of the busbar that project from the shell.

Example 12 is a sensor device according to any of examples 8 to 11, wherein the busbar forms a sidewall of the shell.

Example 13 is a sensor device according to any of examples 8 to 12, wherein the sensor device does not have a magnetic field concentrator.

Example 14 is a sensor device, comprising: a busbar having an opening; and a sensor package, comprising an encapsulation material and a sensor chip encapsulated by the encapsulation material, wherein the sensor chip is designed to detect a magnetic field induced by an electric current flowing through the busbar, and wherein the sensor package is arranged within the opening of the busbar.

Example 15 is a sensor device according to example 14, wherein the encapsulation material is shaped such that the sensor package is locked in the opening of the busbar.

Example 16 is a sensor device according to example 14 or 15, wherein the encapsulation material comprises at least one barb, wherein the sensor package is locked in the opening of the busbar by the barb.

Example 17 is a sensor device according to any of examples 14 to 16, furthermore comprising: a further encapsulation material, wherein the busbar and the sensor package are encapsulated by the further encapsulation material.

Example 18 is a sensor device, comprising: a pre-encapsulated leadframe, comprising a leadframe and an encapsulation material, wherein the leadframe is encapsulated by the encapsulation material, and wherein a part of the leadframe forms a busbar; and a sensor chip arranged above the busbar, wherein the sensor chip is arranged outside the encapsulation material and wherein the sensor chip is designed to detect a magnetic field induced by an electric current flowing through the busbar, wherein in an orthogonal projection of the sensor chip onto the busbar, the sensor chip at least partly overlaps the busbar, and wherein the encapsulation material of the pre-encapsulated leadframe is arranged between the busbar and the sensor chip.

Example 19 is a sensor device according to example 18, wherein a further part of the leadframe forms a connecting conductor that is at least partly free of the encapsulation material, wherein the sensor chip is electrically connected to the connecting conductor.

Example 20 is a sensor device according to example 18 or 19, furthermore comprising: a further encapsulation material formed in an integral fashion, wherein the pre-encapsulated leadframe and the sensor chip are encapsulated by the further encapsulation material.

Although specific implementations have been illustrated and described herein, it is obvious to the person of average skill in the art that a multiplicity of alternative and/or equivalent implementations can replace the specific implementations shown and described, without departing from the scope of the present disclosure. This application is intended to cover all adaptations or variations of the specific implementations discussed herein. Therefore, the intention is for this disclosure to be restricted only by the claims and the equivalents thereof.

What is claimed is:

1. A sensor device, comprising:
   a dielectric substrate;
   a busbar mechanically connected to the dielectric substrate;
   a cavity formed in the dielectric substrate; and
   a sensor chip arranged in the cavity,
      wherein the cavity is hollow apart from components arranged therein,
      wherein the sensor chip is configured to detect a magnetic field induced by an electric current flowing through the busbar, and
      wherein in an orthogonal projection of the sensor chip onto the busbar, the sensor chip at least partly overlaps the busbar.

2. The sensor device as claimed in claim 1, wherein the busbar is formed by an electrical redistribution layer within the dielectric substrate.

3. The sensor device as claimed in claim 1, wherein the busbar is formed by a prefabricated insert that is inserted into the dielectric substrate.

4. The sensor device as claimed in claim 1, wherein the busbar is formed by an electrically conductive layer on an outer surface of the dielectric substrate.

5. The sensor device as claimed in claim 1, wherein an electrical connection to the sensor chip is formed by a metallic redistribution layer in the dielectric substrate.

6. The sensor device as claimed in claim 1, further comprising:
   at least one through hole formed in the dielectric substrate and configured to receive at least one connecting conductor, wherein the at least one received connecting conductor is electrically connected to at least one of the busbar or the sensor chip.

7. The sensor device as claimed in claim 1, further comprising:
   an encapsulation material arranged in the cavity, wherein the sensor chip is encapsulated by the encapsulation material.

8. A sensor device, comprising:
   a shell;
   a busbar arranged in the shell,
      wherein the busbar forms a sidewall of the shell;
   a sensor package arranged in the shell, comprising a sensor chip encapsulated in the sensor package,
      wherein the sensor chip is configured to detect a magnetic field induced by an electric current flowing through the busbar, and
      wherein in an orthogonal projection of the sensor chip onto the busbar, the sensor chip at least partly overlaps the busbar; and
   a connecting conductor electrically connected to the sensor chip,
      wherein parts of the connecting conductor and parts of the busbar project from the shell.

9. The sensor device as claimed in claim 8, further comprising:
   an encapsulation material arranged in the shell, wherein the busbar and the sensor package are encapsulated by the encapsulation material.

10. The sensor device as claimed in claim 8, further comprising:
    a cover, wherein the shell and the cover form a hollow space, and wherein the busbar and the sensor package are arranged in the hollow space.

11. The sensor device as claimed in claim 8, wherein the sensor device is configured to be connected to a circuit board by way of the parts of the connecting conductor and the parts of the busbar that project from the shell.

12. The sensor device as claimed in claim 8, wherein the sensor device does not have a magnetic field concentrator.

13. A sensor device, comprising:
    a busbar having an opening; and
    a sensor package, comprising an encapsulation material and a sensor chip encapsulated by the encapsulation material,
       wherein the sensor chip is configured to detect a magnetic field induced by an electric current flowing through the busbar,
       wherein the sensor package is arranged within the opening of the busbar, and
       wherein the encapsulation material comprises one or more physical locking structures to lock the sensor package to the opening.

14. The sensor device as claimed in claim 13, wherein the encapsulation material is shaped such that the sensor package is locked in the opening of the busbar.

15. The sensor device as claimed in claim 13, wherein the encapsulation material comprises at least one barb, and wherein the sensor package is locked in the opening of the busbar by the barb.

16. The sensor device as claimed in claim 13, further comprising:
    a further encapsulation material, wherein the busbar and the sensor package are encapsulated by the further encapsulation material.

17. The sensor device as claimed in claim 13, further comprising:
    a shell; and
    a connecting conductor electrically connected to the sensor chip,
       wherein the connecting conductor and the busbar project from the shell.

18. A sensor device, comprising:
    a pre-encapsulated leadframe, comprising a leadframe and an encapsulation material,
       wherein the leadframe is encapsulated by the encapsulation material,
       wherein a part of the leadframe forms a busbar, and
       wherein a second part of the leadframe forms a connecting conductor that is at least partly free of the encapsulation material on a top side of the connecting conductor; and
    a sensor chip arranged above the busbar,
       wherein a sensor chip is electrically connected to the connecting conductor;
       wherein the sensor chip is arranged outside the encapsulation material, wherein the sensor chip is configured to detect a magnetic field induced by an electric current flowing through the busbar, wherein in an orthogonal projection of the sensor chip onto the busbar, the sensor chip at least partly overlaps the busbar, and wherein the encapsulation material of the pre-encapsulated leadframe is arranged between the busbar and the sensor chip.

19. The sensor device as claimed in claim 18, further comprising:

a further encapsulation material formed in an integral fashion, wherein the pre-encapsulated leadframe and the sensor chip are encapsulated by the further encapsulation material.

20. The sensor device as claimed in claim 18, wherein the encapsulation material comprises one or more locking structures.

* * * * *